United States Patent
Marvin et al.

(10) Patent No.: US 6,559,730 B1
(45) Date of Patent: May 6, 2003

(54) ELECTRONIC SWITCH WITH STATIC CONTROL VOLTAGE FOR DYNAMICALLY SWITCHING CAPACITANCE IN A FREQUENCY-ADJUSTABLE CRYSTAL OSCILLATOR

(75) Inventors: Dennis F. Marvin, Santa Rosa, CA (US); Jaroslaw Edward Adamski, Streamwood, IL (US)

(73) Assignee: CTS Corporation, Elkhart, IN (US)

( * ) Notice: Subject to any disclaimer, the term of this patent is extended or adjusted under 35 U.S.C. 154(b) by 18 days.

(21) Appl. No.: 09/609,356

(22) Filed: Jul. 5, 2000

(51) Int. Cl.⁷ .............................. H03B 5/32; H03B 5/36
(52) U.S. Cl. .................... 331/158; 331/116 FE; 331/179; 331/66
(58) Field of Search ............... 331/116 R, 116 FE, 331/158, 179, 36 C, 66, 176

(56) References Cited

U.S. PATENT DOCUMENTS

| | | | |
|---|---|---|---|
| 3,754,152 A | * | 8/1973 | Koehler et al. ............ 310/8.1 |
| 4,827,226 A | | 5/1989 | Connell |
| 5,053,723 A | * | 10/1991 | Schemmel .................. 331/14 |
| 5,703,540 A | | 12/1997 | Gazda et al. |
| 5,764,112 A | | 6/1998 | Bal et al. |
| 5,982,246 A | | 11/1999 | Hofhine et al. |
| 5,982,248 A | | 11/1999 | Wagner |
| 5,994,970 A | | 11/1999 | Cole et al. |
| 6,172,576 B1 | * | 1/2001 | Endo et al. ............. 331/116 R |

* cited by examiner

Primary Examiner—David Mis
(74) Attorney, Agent, or Firm—Steven Weseman; Michael Zazzara (57) ABSTRACT

A controllable crystal oscillator includes a crystal resonator having first and second electrodes, a gain stage having first and second terminals connected to the first and second electrodes for starting and maintaining the oscillation, first and second capacitor banks connected to the first and second terminals for providing a capacitive load to the resonator, and first and second dynamic switches interconnected between the terminals and the respective capacitor banks for cycling the capacitor banks in and out of connection.

21 Claims, 6 Drawing Sheets

ELECTRONIC SWITCH WITH STATIC CONTROL VOLTAGE FOR DYNAMICALLY SWITCHING CAPACITANCE IN A FREQUENCY-ADJUSTABLE CRYSTAL OSCILLATOR

TECHNICAL FIELD

This invention relates to voltage controlled crystal oscillators, and in particular, to crystal oscillators which can be tuned, temperature compensated, or synchronized.

BACKGROUND

For generating frequency reference signals in radio telephones and pagers, quartz crystal based oscillators predominate. Quartz crystal resonators offer several comparative advantages; they are inert, relatively power efficient, frequency stable and size scalable. However advantageous, crystal resonators present some practical problems. When quartz crystal is manufactured in an economical manner, its resonant frequencies cannot be predicted (or controlled) with an accuracy sufficient for many applications. Furthermore, the oscillating frequency of known quartz crystals is temperature dependant—the sensitivity varying according to crystal cut and crystal quality generally.

Accordingly, crystal oscillator circuits are both factory tuned to account for manufacturing variances and also equipped with features for temperature compensation. In the basic circuit design, an inverter and biasing resistor are each connected in parallel with the crystal resonator. The inverter and biasing resistor serve to start and then maintain the oscillation. An adjustable capacitance element such as a varactor is connected to the quartz crystal to allow frequency adjustment for factory tuning and temperature compensation. A voltage responsive temperature sensing element is scaled and operably connected to the adjustable capacitance element to provide temperature compensation of the oscillator frequency.

This frequency adjustment is conventionally called "warping" or "pulling," labels which reflect the relative difficulty in changing the frequency of crystal-based oscillators. The stability of crystal circuits with greater adjustability (or gain) is generally more fragile because of increased susceptibility to noise. Accordingly, a compromise exists in oscillator design between increased frequency adjustability and stability.

Although such crystal-based oscillator circuits have received widespread commercial acceptance, efforts at improvement on this basic design continued. For example, U.S. Pat. No. 5,994,970 to Cole et al. describes a temperature compensation circuit employing a switched capacitor array in which the capacitor switch settings are continually adjusted in response to temperature changes. This approach of dynamically adjusting the settings of a switched capacitor array requires special controls to prevent related capacitor discharges from disrupting the oscillator reference signal. U.S. Pat. No. 4,827,226 to Connell et al. is directed to an oscillator circuit with a chip-integrated set of abrupt junction varactors for adjusting a capacitive load and the resulting oscillator frequency. Unfortunately, such integrated junction varactors occupy a relatively large area on a semiconductor chip. In summary, these and other conventional approaches suffer from one or more serious drawbacks including insufficient frequency gain, poor capacitive load selectivity, increased noise sensitivity, excessive manufacturing cost and chip integration incompatibility.

In the interest of allowing wireless communication providers to provide additional service, governments worldwide have allocated new higher RF frequencies for commercial use. To better exploit these newly allocated frequencies, standard setting organizations have adopted bandwith specifications with compressed transmit and receive bands as well as individual channels. These trends are pushing the limits of oscillator technology to provide sufficient frequency selectivity.

Coupled with the tighter frequency control requirements are the consumer market trends towards ever smaller wireless communication devices (e.g. handsets) and longer battery life. Combined, these trends place difficult constraints on the design of wireless components such as oscillators. Oscillator designers may not simply add more space-taking components or increase power dissipation in order to provide improved accuracy and stability.

Therefore, the need continues for improved oscillators which can offer frequency selectivity, size reduction and other performance improvements.

SUMMARY

A controllable oscillator suitable for use in generating reference signals for signal frequency control in wireless communication devices is provided. The oscillator includes a crystal resonator having first and second electrodes, a gain stage having first and second terminals connected to the first and second electrodes for starting and maintaining the oscillation, first and second capacitor banks connected to the first and second terminals for providing a capacitive load to the resonator, and first and second dynamic switches interconnected between the terminals and the respective capacitor banks for cycling the capacitor banks in and out of connection.

The first bank of capacitors provides a capacitive load to the crystal resonator at the first terminal, while the second bank of capacitors provides a capacitive load to the crystal resonator at the second terminal. Each bank of capacitors includes at least two capacitors connected in parallel connected to a reference voltage source such as local ground in a parallel configuration. And, each bank of capacitors includes at least one static switch operably connected to one of the two capacitors for switching the capacitor in and out and thereby selectively increasing and decreasing the capacitive load presented by the bank of capacitors.

The first dynamic switch is interconnected between the first terminal and the first bank of capacitors and has a control input for receiving a DC control voltage. The second dynamic switch is interconnected between the second terminal and the second bank of capacitors and has a separate control input for receiving a DC control voltage. Each dynamic switch is responsive to a voltage difference between the respective control input and the respective (first or second) terminal such that a selected DC voltage at the control input can cause the dynamic switch to connect a bank of capacitors to the crystal resonator for a fraction of the period of oscillation.

In a preferred embodiment, the first dynamic switch is a transistor with a gate which serves as a control input and first and second source/drain regions. The first source/drain is connected to the first terminal and the second source/drain is connected to the first bank of capacitors. The second dynamic switch is preferably a transistor having a gate (as control input) and first and second source/drain regions connected between the second terminal and the second bank of capacitors. For this preferred configuration, the transistor switch acts in response to the source/drain-to-gate DC voltage differential.

Described in more general terms, oscillators according to this invention include a crystal resonator circuit, a static frequency corrector operably coupled to the crystal resonator circuit for applying a time-fixed frequency adjustment to the output frequency, and a dynamic frequency adjuster operably coupled between the resonator circuit and the static frequency corrector for limiting the period in which the static frequency corrector is connected to the crystal resonator.

There are other advantages and features of this invention which will be more readily apparent from the following detailed description of the preferred embodiment of the invention, the drawings, and the appended claims.

BRIEF DESCRIPTION OF THE FIGURES

In the FIGURES.

DETAILED DESCRIPTION OF PREFERRED EMBODIMENTS

While this invention is susceptible to embodiment in many different forms, this specification and the accompanying drawings disclose only preferred forms as examples of the invention. The invention is not intended to be limited to the embodiments so described, however. The scope of the invention is identified in the appended claims.

Figure 1:
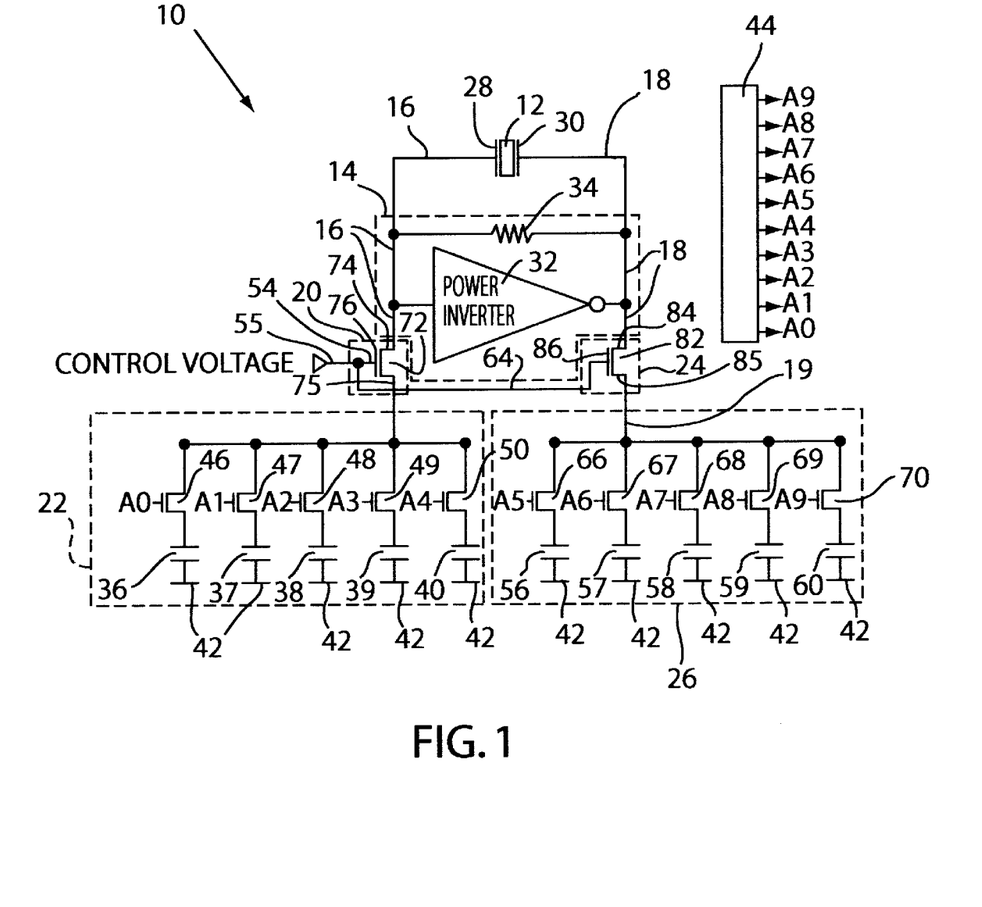
FIG. 1 is a schematic diagram of a preferred embodiment of the controllable crystal oscillator of FIG. 7.

Referring to FIG. 1, a controllable oscillator 10 comprises a crystal resonator 12 and a gain stage 14 with first terminal 16 and second terminal 18. Oscillator 10 further comprises a first dynamic switch 20 for controllably connecting a first capacitor bank 22 to resonator 12 via first terminal 16, and a second dynamic switch 24 for controllably connecting a second capacitor bank 26 to resonator 12 via second terminal 18. As used herein, the word terminal is a reference to a general point of interconnection (i.e. node) for conductive pathways in a circuit used to explain the extent of conductive pathways in a circuit. Use of the word terminal is not intended to imply any special point of module interconnection or interface.

Crystal resonator 12 includes first and second electrodes, which are only represented symbolically in FIG. 1 and assigned reference numerals 28 and 30, respectively. Gain stage 14 preferably includes an inverting amplifier 32 and a feedback resistor 34.

First capacitor bank 22 provides a statically adjustable capacitive load to crystal resonator 12 at first terminal 16. Reflecting a generally parallel circuit arrangement, second capacitor bank 26 provides a statically adjustable capacitive load to crystal resonator 12 at second terminal 18. First capacitor bank 22 (or bank of capacitors) includes five capacitors 36, 37, 38, 39 and 40, which are individually switchable to be active or inactive in the circuit via respective switching transistors 46, 47, 48, 49 and 50. The capacitors of second capacitor bank 26 have been assigned reference numerals 56, 57, 58, 59 and 60. Second capacitor bank 26 is equipped with switching transistors for each capacitor, namely switching transistors 66, 67, 68, 69 and 70. The capacitors are arranged in a parallel circuit configuration, with each parallel leg being coupled to a source of reference voltage 42, such as a local ground.

Individual capacitor control lines A0 through A9 are used to switch the switching transistors 46 through 50 and 66 through 70, and thereby set the effective capacitance of each capacitor bank 22 and 26. The DC voltages of control lines A0 through A0 are set by a relatively static memory module 44, which can be programmed to correct (or offset) for variances in the frequency of oscillator 10 caused by manufacturing variances. Memory module 44 may be a ROM, EPROM or the like integrated with or separate from the components of oscillator 10. In a preferred embodiment of this invention, however, the memory module 44 is an EPROM integrated with the oscillator components.

For enhanced frequency adjustability and selectivity, each capacitor bank 22 and 26 includes capacitors having different capacitances. In an especially preferred embodiment of this invention, each capacitor bank 22 and 26 is equipped with capacitors with a range of capacitances as given in Table I, below.

TABLE I

| Capacitor Reference No. | Capacitance (pico Farads) |
|---|---|
| First Capacitor Bank (22): | |
| 36 | 0.7 |
| 37 | 1.4 |
| 38 | 2.8 |
| 39 | 5.6 |
| 40 | 11.2 |
| Second Capacitor Bank (26): | |
| 56 | 1.4 |
| 57 | 2.8 |
| 58 | 5.6 |
| 59 | 11.2 |
| 60 | 22.4 |

Figure 2:
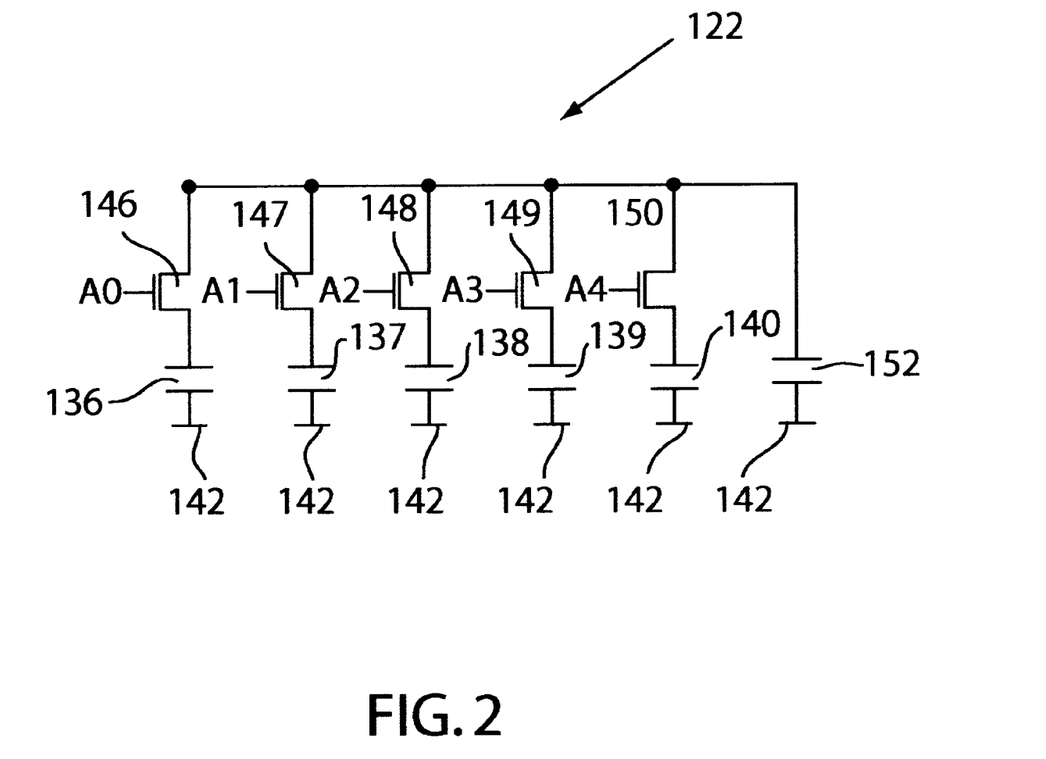
FIG. 2 is a simplified circuit diagram for a bank of individually switchable capacitors according to an alternate embodiment of this invention.

FIG. 2 illustrates one of several optional approaches for building a bank of switchable capacitors. Capacitor bank 122 includes six capacitors 136, 137, 138, 139, 140 and 152 arranged in parallel to a reference voltage 142, such as ground. Five of the six capacitors are coupled in series to switching transistors 146, 147, 148, 149 and 150. A sixth capacitor 152, however, is not switchable. Hence, this invention contemplates switched capacitor banks (or switched capacitor arrays) in which some of the capacitor legs are fixed and not switchable via an individual capacitor.

Referring back to FIG. 1, first dynamic switch 20 includes a control input 54 and is interconnected between first terminal 16 and first capacitor bank 22, while second dynamic switch 24 includes a control input 64 and is interconnected between second terminal 18 and second capacitor bank 26.

In a preferred embodiment of this invention, first and second dynamic switches 20 and 24 are NMOS transistors, assigned reference numerals 72 and 82, respectively. NMOS transistor 72 has a source/drain 74 connected to first terminal 16 and a source/drain 75 connected to first capacitor bank 22. Gate 76 serves as an input for accepting a control voltage. Likewise, NMOS transistor 82 has a source/drain 84 connected to second terminal 18 and a source/drain 85 connected to second capacitor bank 26 with a gate 86. As illustrated in FIG. 1 control inputs 54 and 64 are preferably coupled to form a single control input 55.

NMOS transistors 72 and 82 allow adjustment of both the level of resistance in series with each capacitor bank (22 and 26) and the time within each oscillation cycle in which the capacitor banks are connected to crystal resonator 12. In this manner, the effective capacitive load presented to crystal resonator can be modified as desired.

Figure 3:
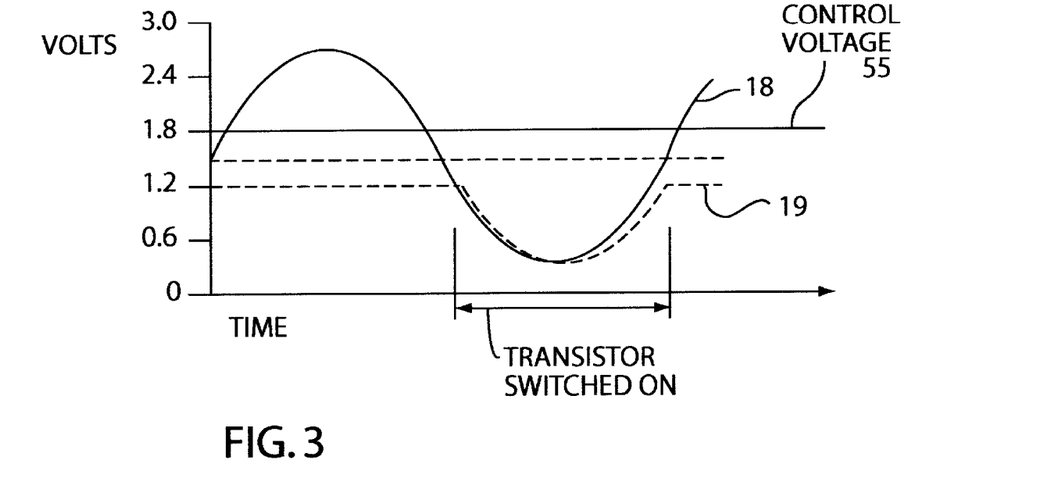
FIG. 3 is a time graph of voltage at points around the second dynamic switch which illustrates the connection time for the second bank of capacitors at a given control voltage.
Figure 4:
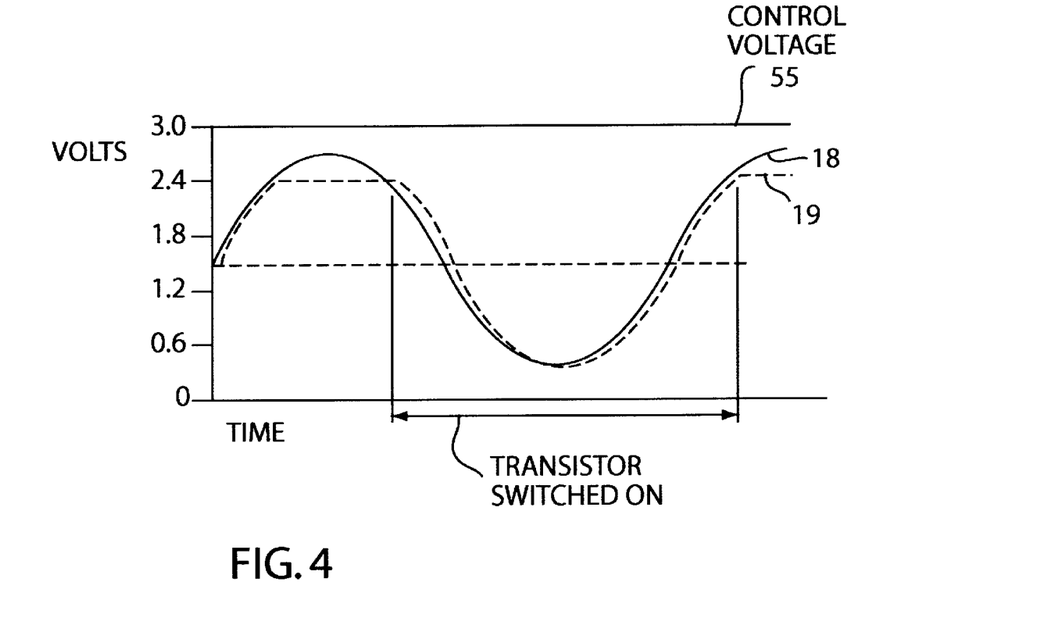
FIG. 4 is another time graph of voltage at points around the second dynamic switch which illustrates a change in connection time resulting from a change in the control voltage.

FIGS. 3 and 4 help explain the function of NMOS transistors 72 and 82 in oscillator 10. FIGS. 3 and 4 show the steady-state voltage waveforms for second terminal 18 and node 19 of the oscillator of FIG. 1 at different voltages of control input 55 where the voltage supplied to inverter 32 of gain stage 34 is about 3 volts, although other operating ranges are contemplated. The voltage at first and second terminals 16 and 18 oscillates from about 0.4 volts to about 2.7 volts, i.e., a peak-to-peak amplitude of about 2.3 volts.

NMOS transistors 72 and 82 are responsive to the voltage difference between their respective gates 76 and 86 and first and second terminals 16 and 18, respectively. NMOS transistors preferably have a threshold voltage of about 0.65 volts, although other operating ranges are contemplated. Accordingly, transistor 72 turns on when the voltage difference between combined control input 55 and first terminal 16 approaches or exceeds about 0.65 volts, and likewise for transistor 82 with respect to second terminal.

With the voltage of combined input 55 set at about 1.8 volts, transistor 82 switches on when the oscillating voltage at second terminal 18 falls below about 1.20 volts in its cycle as shown in FIG. 3. Capacitor bank 26 is connected to and charged by resonator 12 when transistor 82 is switched on. As the oscillation cycle continues, the voltage at second terminal 18 increases above about 1.15 so that transistor 82 switches off disconnecting capacitor bank 26 from resonator 12.

FIG. 4 shows the steady-state voltage waveform for the same elements with the voltage of control input 55 set at about 3 volts. As illustrated, the higher input voltage results in transistor 82 being switched on for a larger fraction of the oscillating cycle.

Transistor 72, terminal 16 and capacitor bank 22 operate in the same way but at opposite phase. Thus, by varying the control input voltage, the time-averaged capacitve load on resonator 12 can be adjusted thereby changing the oscillator frequency. Increased control input voltages result in increased capacitive loads, and therefore, lower oscillator frequencies.

The circuit resistance effects of the transistors controls (72 and 82) on the oscillator circuit are compatible with this continuous voltage-based control mechanism. The NMOS transistors according to the preferred embodiment of this invention operate in series with the capacitor banks. The average resistance of NMOS transistors drops as the gate voltage is increased. Thus the connection time and transistor resistance effects cooperate providing improved frequency controllability.

Figure 5:
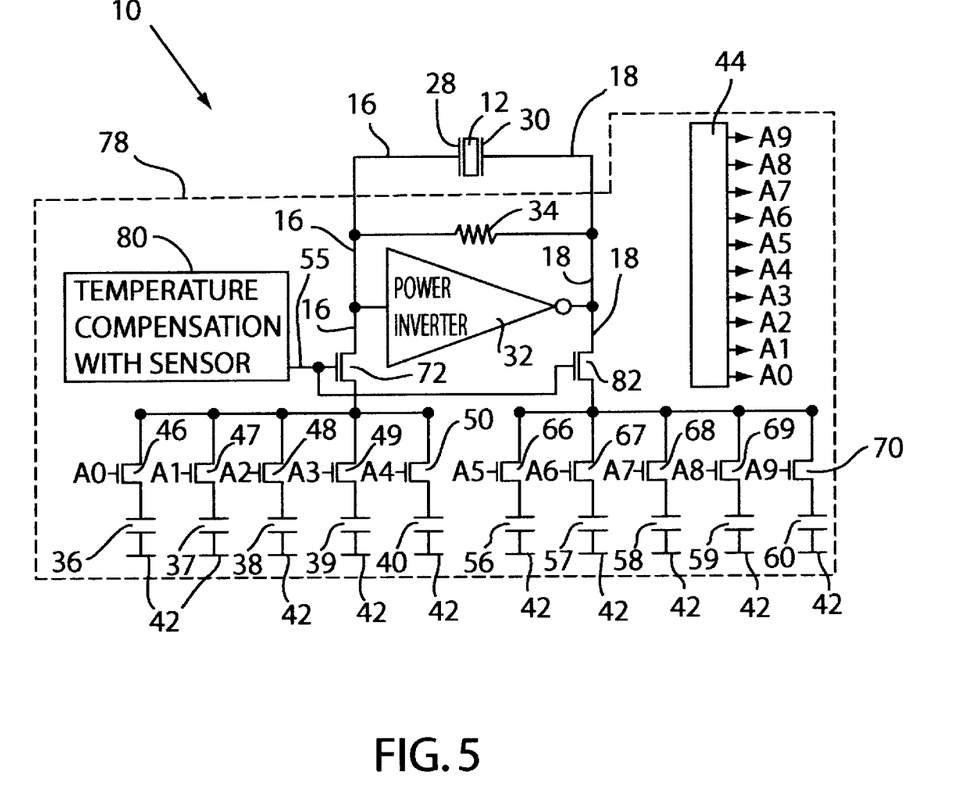
FIG. 5 is a schematic diagram of an exemplary controllable crystal oscillator illustrating aspects of modularization.

FIG. 5 is a schematic diagram of oscillator 10 indicating which circuit elements are integrated into a single semiconductor chip module 78 in a preferred configuration. All oscillator components except crystal resonator 12 are integrated on a single chip module 78. Temperature compensation circuitry 80 is on chip module 78 to offset variations in oscillator frequency due to temperature changes.

Figure 6:
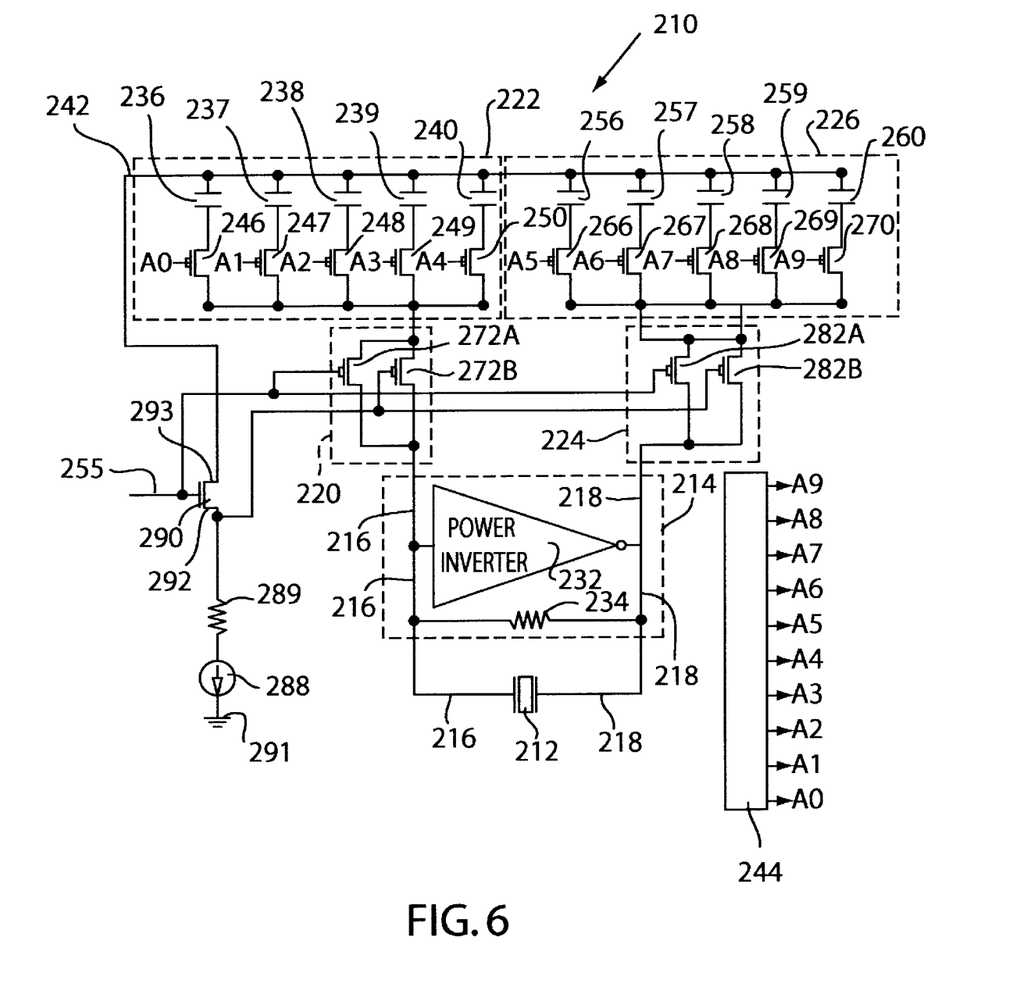
FIG. 6 is a schematic diagram of a controllable oscillator according to another embodiment of this invention.

FIG. 6 is simplified circuit diagram for another oscillator embodying this invention, an oscillator 210. Within FIG. 6, elements similar to those identified in FIG. 1 have been assigned corresponding reference numbers. Oscillator 210 includes a crystal resonator 212, a gain stage 214, first and second terminals 216 and 218, dynamic switches 220 and 224, and corresponding capacitor banks 222 and 226. Gain stage 214 includes an inverting amplifier 232 and feedback resistor 234.

Dynamic switch 220 controllably connects first capacitor bank 222 to resonator 212 via first terminal 216, and dynamic switch 224 controllably connects second capacitor bank 226 to resonator 212 via second terminal 218.

First capacitor bank 222 provides an adjustable capacitive load to crystal resonator 212 at first terminal 216. Second capacitor bank 226 provides an adjustable capacitive load to crystal resonator 212 at second terminal 218. First capacitor bank (or array) 222 includes five capacitors 236, 237, 238, 239 and 240, which are individually switchable to be active or inactive in the circuit via respective switching transistors 246, 247, 248, 249 and 250. The capacitors of second capacitor bank 226 have been assigned reference numerals 256, 257, 258, 259 and 260. Capacitor bank 226 is equipped with switching transistors 266, 267, 268, 269 and 270. The capacitors are arranged in a parallel circuit configuration, with each parallel leg being coupled to a source of reference voltage 242, which in this embodiment is not a ground potential source but instead is linked to a current source 288 via a transistor 290 such that reference voltage 242 can be positive.

Individual capacitor control lines A0 through A9 are used to switch the switching transistors 246 through 250 and 266 through 270 and thereby set the effective capacitance of each capacitor bank 222 and 226. The DC voltages of control lines A0 through A9 are set by a relatively static memory module 244 which has been programmed to tune (or offset) for frequency or controllability variances. In the same way as noted in Table 1 above for oscillator 10, each capacitor bank 222 and 226 is preferably scaled with capacitors having a range of capacitances.

Oscillator 210 employs two sets of two PMOS transistors to serve as dynamic switches 220 and 224. Specifically, dynamic switch 220 includes PMOS transistors 272A and 272B, while dynamic switch 224 includes PMOS transistors 282A and 282B. These parallel sets of controlling transistors (272A,B and 282A,B) provide a control voltage-to-oscillator frequency response function that is relatively more linear and greater in range of selectable oscillator frequencies. Furthermore, because oscillator 210 employs PMOS rather than NMOS transistors for dynamic switching, oscillator frequency more conveniently moves in the same direction as control voltage 255. Specifically, PMOS transistors are closed off by increases in gate voltage. In oscillator 210, increases in control voltage 255 close off the PMOS transistors 272A, 272B, 282A and 282B, and thereby reduce the average capacitive load on resonator 212.

Control voltage 255 for transistors 272A, 272B, 282A and 282B is distributed into two levels via a transistor 290, a resistor 289 and a current source 288 linked to a source of ground potential 291. Together, these components form a voltage level shifting circuit. The gates of transistors 272A and 282A are connected to control voltage input source 255 and the gates of transistor 272B and 282B are connected to a source/drain 292 of transistor 290. As noted above, each parallel capacitor leg of capacitor banks 222 and 226 are connected together and to source/drain 293 of transistor 290.

Each pair of controlling transistors 272A, 282A and 272B, 282B can be adjusted at different gate voltages. In this way, the average capacitive load present by capacitor banks 222 and 226 to resonator 212 can be increased progressively.

Figure 7:
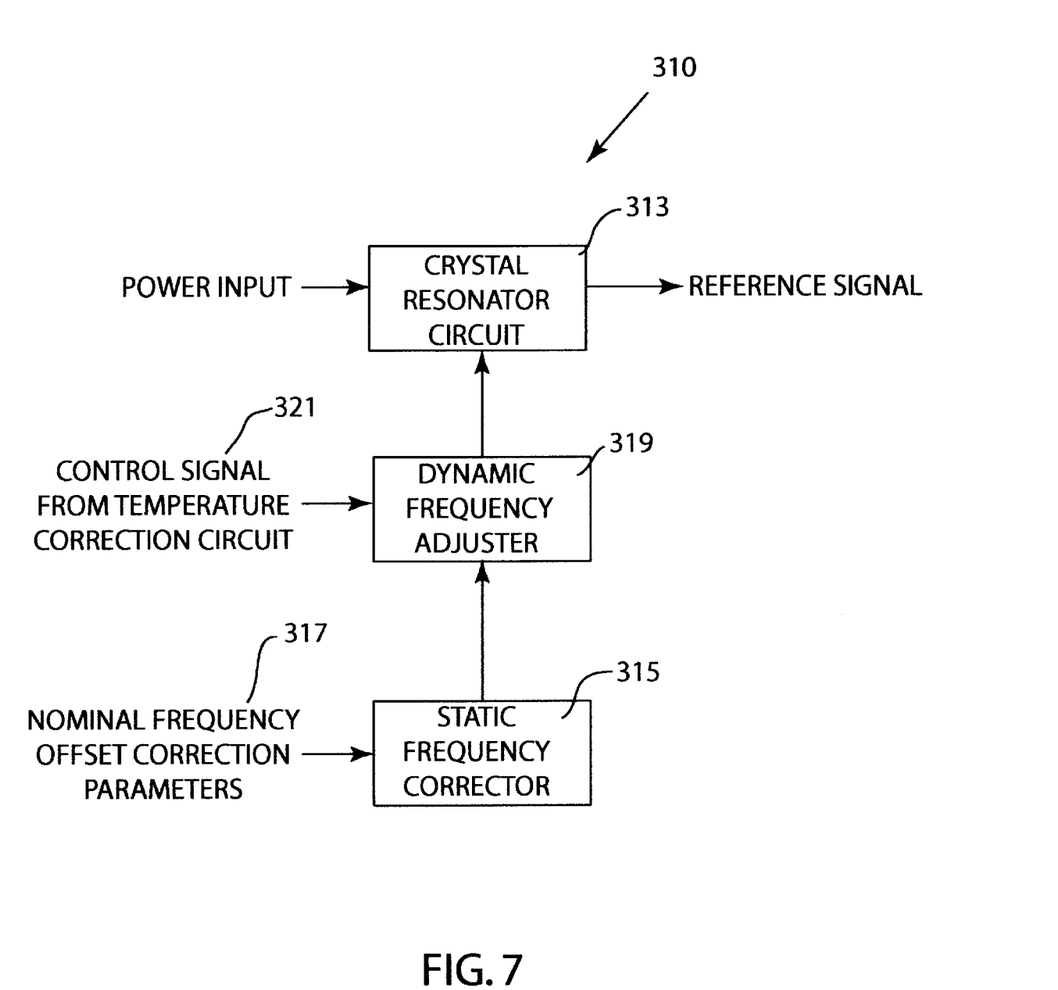
FIG. 7 is a block diagram of an exemplary controllable crystal oscillator embodiment of the this invention.

Referring now to FIG. 7, a generalized control scheme for a crystal-based oscillator is illustrated in block format to demonstrate the various possible applications of this invention. Oscillator 310 includes a crystal resonator circuit 313 operably coupled to a static frequency corrector 315 for introducing a frequency-modifying capacitive load to resonator circuit 313. Static frequency corrector 315 is static in that its steady-state measured capacitance load to an oscillating circuit does not change over the oscillation period. Static frequency corrector 315 does provide an adjustable capacitance such as switched capacitor bank 22 of FIG. 1. Specifically, static frequency corrector 315 can accept parameters 317 in digital or analog format which set the steady-state capacitive load of the static frequency corrector 315.

Oscillator 310 also includes a dynamic frequency adjuster 319 operably interconnected between static corrector 315 and crystal resonator circuit 312. Dynamic frequency adjuster 319 is responsive to a control signal 321 produced by a temperature compensation circuit. Dynamic frequency adjuster 319 governs the connection between resonator circuit 312 and static frequency corrector 315 such that the capacitive load of the frequency corrector can be applied for all or only a fraction of the oscillation cycle. As noted above and illustrated in FIGS. 1, 5 and 6, dynamic frequency adjuster 319 preferably includes dynamically controllable switches in the form of NMOS transistors.

This invention offers several key features in oscillator design. Oscillators of this invention provide separate independent mechanisms for altering the oscillator frequency and controllability: a relatively static adjustment via the bank of switchable capacitors and a relatively dynamic adjustment via the dynamic switches. The static adjustment provided by the capacitor banks can be used during manufacturing to tune the nominal frequency and adjust the frequency gain available via the dynamic switches. The dynamic switch correction mechanism is then made available for temperature compensation or frequency adjustments required for signal synchronization with a mobile communication system base station.

Another key feature, oscillators of this invention can be fully integrated (except for the crystal) into a single semiconductor chip module. The transistor and capacitor components of this invention can be chip based. Oscillators of this invention are chip integratable because they do not require separate hyper-abrupt junction varactors which are found in conventional designs to provide sufficient control over oscillator frequency.

Numerous variations and modifications of the embodiments described above may be effected without departing from the spirit and scope of the novel features of the invention. No limitations with respect to the specific system illustrated herein are intended or should be inferred. It is, of course, intended to cover by the appended claims all such modifications as fall within the scope of the claims.

We claim:

1. An oscillator, having an adjustable frequency and a period of oscillation, comprising:
    a crystal resonator having first and second electrodes;
    a gain stage having first and second terminals connected to the first and second electrodes, respectively;
    a first bank of capacitors for providing a capacitive load to the crystal resonator at the first terminal;
    a second bank of capacitors for providing a capacitive load to the crystal resonator at the second terminal;
    each bank of capacitors having at least two capacitors connected in parallel connected to a reference voltage source and at least one switch operably connected to one of the at least two capacitors for selectively increasing and decreasing the capacitive load;
    a first dynamic switch interconnected between the first terminal and the first bank of capacitors, the first dynamic switch having a control input for receiving a static control voltage, the first dynamic switch being responsive to a voltage difference between the static control voltage and a voltage at the first terminal; and
    a second dynamic switch interconnected between the second terminal and the second bank of capacitors, the second dynamic switch having a control input for receiving a second static control voltage, the second dynamic switch being responsive to a voltage difference between the second static control voltage of the second dynamic switch and a voltage at the second terminal.

2. The oscillator of claim 1 wherein the first dynamic switch is a transistor having a gate which serves as the control input and first and second source/drain regions, the first source/drain being connected to the first terminal and the second source/drain being connected to the first bank of capacitors,
    and wherein the second dynamic switch is a transistor having a gate which serves as the control input and first and second source/drain regions, the first source/drain being connected to the second terminal and the second source/drain being connected to the second bank of capacitors.

3. The oscillator of claim 2 wherein the first and second dynamic switches are each NMOS transistors.

4. The oscillator of claim 1 wherein the at least one switch of each bank of capacitors is transistor-based.

5. The oscillator of claim 1 in which all elements except the crystal are part of an integrated semiconductor module.

6. The oscillator of claim 1 wherein the crystal resonator includes an AT-cut style crystal.

7. The oscillator of claim 1 wherein the control input of the first dynamic switch is connected to the control input of the second dynamic switch to provide a common control input.

8. The oscillator of claim 1 wherein the gain stage includes an inverter and a resistor, the inverter and the resistor each being connected in parallel between the first electrode and the second electrode.

9. The oscillator of claim 1 in which the static control voltage and the second static control voltage are substantially identical.

10. The oscillator of claim 9 in which the static control voltage is preselected to cause the first dynamic switch and the second dynamic switch to close in response to the oscillating voltage at the first and second electrodes, respectively, of the crystal resonator.

11. The oscillator of claim 10 in which the static control voltage is preselected to cause the first dynamic switch and the second dynamic switch to close in order to increase the period of oscillation of the crystal resonator.

12. The oscillator of claim 1 in which the one capacitor of the at least two capacitors of the capacitor bank is operably connected to the crystal resonator during a part of each period of oscillation of the crystal resonator.

13. The oscillator of claim 12 in which the part of each period of oscillation of the crystal resonator that the capacitor bank is operably connected to the crystal resonator is a peak negative period.

14. A crystal-based oscillator having an adjustable frequency and a period, the oscillator circuit comprising:

a crystal resonator having first and second electrodes;

a gain stage having first and second terminals connected to the first and second electrodes, respectively;

a first bank of individually switchable capacitors for providing a capacitive load to the crystal resonator at the first terminal;

a second bank of individually switchable capacitors for providing a capacitive load to the crystal resonator at the second terminal;

a first transistor having first and second source/drain regions and a gate, the first source/drain being connected to the first terminal and the second source/drain being connected to the first bank of capacitors, and the gate being connected to a static voltage, the static voltage preselected such that, during each period of the crystal-based oscillator, the capacitive load of the first bank is controllably applied at the first terminal in response to a voltage differential between the gate and the first terminal; and a second transistor having first and second source/drain regions and a gate, the first source/drain being connected to the second terminal and the second source/drain being connected to the second bank of capacitors, and the gate being connected to a static voltage, the static voltage preselected such that, during each period of the crystal-based oscillator, the capacitive load of the second bank is controllably applied at the second terminal in response to a voltage differential between the gate and the second terminal.

15. The oscillator of claim 14 wherein each bank of switchable capacitors includes five capacitors.

16. The oscillator of claim 14 wherein each bank of individually switchable capacitors includes capacitors having different capacitances.

17. The oscillator of claim 14 wherein each bank of individually switchable capacitors includes five capacitors, each capacitor within a bank having a different capacitance value.

18. The oscillator of claim 17 wherein each bank of individually switchable capacitors includes switching transistors operably connected to the capacitors.

19. A semiconductor integrated module suitable for use with a crystal resonator to generate a reference signal of a desired frequency, the module comprising:

a biased inverter stage having first and second terminals operably connected to the crystal resonator;

a first bank of individually switchable capacitors for providing a capacitive load to the crystal resonator at the first terminal;

a second bank of capacitors for providing a capacitive load to the crystal resonator at the second terminal;

a first dynamic switch interconnected between the first terminal and the first bank of capacitors, the first dynamic switch having a control input for receiving a preselected static voltage, the first dynamic switch being responsive to a voltage difference between the preselected static voltage at the control input and a voltage at the first terminal; and a second dynamic switch interconnected between the second terminal and the second bank of capacitors, the second dynamic switch having a control input for receiving a preselected static voltage, the second dynamic switch being responsive to a voltage difference between the preselected static voltage at the control input and a voltage at the second terminal.

20. The module of claim 19 wherein the first dynamic switch is a MOS transistor having a gate which serves as the control input and first and second source/drain regions, the first source/drain being connected to the first terminal and the second source/drain being connected to the first bank of capacitors, and wherein the second dynamic switch is a MOS transistor having a gate which serves as the control input and first and second source/drain regions, the first source/drain being connected to the second terminal and the second source/drain being connected to the second bank of capacitors.

21. The module of claim 19 further including a memory module operably coupled to each bank of individually switchable capacitors for selectively activating capacitors, the memory module being programmed to set the capacitive load for each bank of individually switchable capacitors to correct for a variance between a frequency of the reference signal and the desired frequency.

* * * * *